United States Patent [19]

Sun

[11] 4,043,836
[45] Aug. 23, 1977

[54] METHOD OF MANUFACTURING SEMICONDUCTOR DEVICES

[75] Inventor: Yen Sheng Edmund Sun, Liverpool, N.Y.

[73] Assignee: General Electric Company, Auburn, N.Y.

[21] Appl. No.: 682,581

[22] Filed: May 3, 1976

[51] Int. Cl.² .......................................... H01L 21/263
[52] U.S. Cl. .................................. 148/1.5; 148/187; 357/91
[58] Field of Search .................... 148/1.5, 187; 357/91

[56] References Cited

U.S. PATENT DOCUMENTS

| 3,507,709 | 4/1970 | Bower .................................. 148/1.5 |
| 3,829,961 | 8/1974 | Bauërlein et al. ................. 148/1.5 X |
| 3,881,964 | 5/1975 | Cresswell et al. .................... 148/1.5 |
| 3,941,625 | 3/1976 | Kennedy et al. ..................... 148/187 |
| 3,943,013 | 3/1976 | Kennedy et al. ..................... 148/187 |

*Primary Examiner*—L. Dewayne Rutledge
*Assistant Examiner*—J. M. Davis
*Attorney, Agent, or Firm*—R. J. Mooney; D. E. Stoner

[57] ABSTRACT

Disclosed is a method of manufacturing semiconductor devices including a step of irradiating the devices to alter the turnoff and forward drop characteristics thereof. The irradiation is carried out at a temperature above 100° C, and preferably in the range of 150° to 375° C. No post irradiation annealing step is required.

5 Claims, 7 Drawing Figures

ELECTRON ENERGIES IN SILICON

METHOD OF MANUFACTURING SEMICONDUCTOR DEVICES

BACKGROUND OF THE INVENTION

This invention relates to the manufacture of semiconductor devices and, more particularly, to irradiation of semiconductor devices to improve the electrical characteristics thereof.

Since their introduction, power semiconductors have become more widely used, as circuit designers have continued to employ them in new and different ways. As new applications for these devices are developed, greater emphasis is placed on improving the performance of the devices under demanding conditions of operation. Different applications require that the emphasis be placed on different characteristics of the device. For example, some potential applications will become commercially feasible only if the cost of the devices can be reduced. Other applications require that devices be able to withstand higher reverse voltages, or that they switch from a conductive to a nonconductive state more rapidly. Thus, the device designer is faced with a multi-faceted problem.

One of the principal concerns of the device designer is the interrelationship among the various device characteristics. For example, certain methods of controlling the device turnoff time are known. Gold or platinum can be diffused into the device body, or the device body can be irradiated. Functionally, these two methods are similar in that both create recombination centers that stimulate carrier recombination, thus depleting the semiconductor device of mobile minority carriers more rapidly. However, these methods also affect other device characteristics. For example, the gold diffusion generally increases the the device leakage current and is costly. Irradiation typically increases the semiconductor device's forward voltage drop.

Work has been done in the past to alleviate the aforementioned problems. For example, see U.S. Pat. Nos. 3,941,625 and 3,943,013, both Kennedy et al., and the pending application of Moyson, Ser. No. 616,404, filed Sept. 24, 1975, and entitled, "Gold Diffused Thyristor and Method of Manufacture," and the pending application of Kennedy, et al., Ser. No. 654,282, filed Feb. 2, 1976, and entitled, "Glass Passivated Gold Diffused Rectifier Pellet and Method for Making". These patents and applications, assigned to the assignee of the present invention, deal with methods of selectively controlling gold or platinum diffusion so that the impurity is put only where it is needed to stimulate carrier recombination, thus minimizing its affect on other device properties.

Work has also been done on alleviating the undesired adverse effects of device irradiation. For example, see U.S. Pat. Nos. 3,881,964 and 3,888,701. These two patents teach an annealing step following device irradiation. The irradiation taught by these references is carried out at room temperature. Radiation damage may cause some heating of the crystal, but it is doubtful that the crystal ever exceeds 70° or 80° C in temperature. In general, it is explained in the last referenced patent that as a semiconductor device is irradiated, the turnoff time exhibited by the device is decreased; however, the forward voltage drop increases. That, of course, was known in the prior art. It is further taught in the patents that annealing the devices for up to 120 hours following irradiation will cause a decrease in the forward voltage drop. There will be some increase of the recovery time due to the anneal, but not up to its original high value.

A problem which occurs when practicing the irradiate and anneal sequence described in the aforementioned patents is that an excessive amount of energy and time, and thus money, are consumed in the device manufacture. The time comsumption is, of course, obvious. Following irradiation, the devices are annealed at an elevated temperature for a time which may exceed 100 hours, and the irradiate-anneal cycle may be carried out more than once. With respect to energy consumption, heating devices, such as ovens, are high energy consumers and thus are expensive to operate for such long time periods.

It is an object of this invention, therefore, to provide a method of manufacturing power semiconductors exhibiting the rapid turnoff properties of gold doped or irradiated devices, also, to alleviate the aforementioned deficiencies of excessive forward voltage drop, high leakage current, and high cost.

SUMMARY OF THE INVENTION

This invention is characterized by a method of manufacturing semiconductor devices including the step of irradiating the devices at a temperature in excess of about 100° C. The invention is useful for power semiconductors such as SCR's, rectifiers, and triacs. The irradiation is preferably electron irradiation. Electron irradiation is preferred because of its higher energy than, for example, gamma radiation and thus its more rapid alteration of the semiconductor device properties. Preferably, the electron irradiation is of an energy level in excess of about 250 Kev. It is felt that energies below this level result in an excessive number of elastic collisions within the crystal lattice and thus do not efficiently alter device characteristics.

It has been found that by irradiating at the elevated temperature, the total energy input to the crystal lattice, from both irradiation and thermal effects, causes a much more rapid lattice change than is normally effected by irradiation and a subsequent anneal. Thus, while irradiation at the elevated temperature may be carried on for less than sixty seconds, the results are similar to those obtained by irradiation for even a somewhat longer period of time at room temperature and a subsequent anneal of many hours. Thus, it is evident that there is a substantial time and cost saving involved in the practice of the present invention.

DESCRIPTION OF THE DRAWINGS

These and other features and objects of the present invention will become more apparent upon the perusal of the following description taken in conjunction with the accompanying drawings wherein.

DESCRIPTION OF THE PREFERRED METHOD

Figure 1:
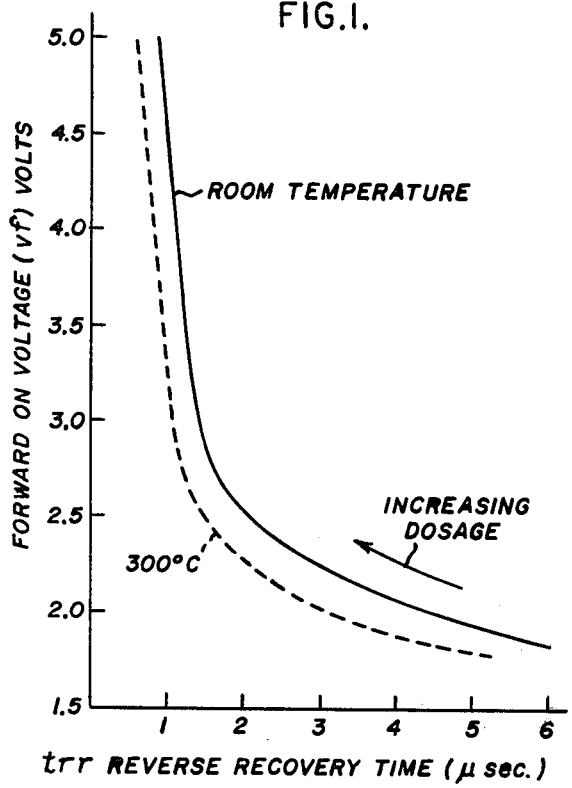
FIG. 1 illustrates the relative effects of irradiation of a semiconductor device at room temperature and at an elevated temperature.

Referring first to FIG. 1, there are shown two trade-off curves for semiconductor devices, specifically power rectifier diodes. The curves illusrate the effects of varying doses of irradiation at room temperature and at an elevated temperature. As shown, the reverse recovery time of each rectifier decreases as the dosage of irradiation received is increased. That is true both for the devices irradiated at room temperature and for the devices irradiated at an elevated temperature, in this example, of 300° C. However, a penalty for the faster recovery is paid. Specifically, the forward voltage drop of the devices increases with increasing radiation dosage. The explanation for these two effects is simply that the irradiation creates lattice defects which provide recombination centers for the mobile minority carriers in the crystal. Thus, following the removal of voltage, mobile carriers quickly recombine at these recombination centers. This is well known in the prior art. Concomitantly, as the crystal structure becomes less and less perfect due to radiation damage, the crystal becomes more resistive and thus the higher voltage drop occurs.

It will be appreciated that the closer a device comes to being ideal, the closer its trade-off curve passes to the origin of the graph indicating zero reverse recovery time and zero forward voltage drop. It should be noted that at all points, the curve illustrating the effects of irradiation at an elevated temperature is more attractive than the curve illustrating the effect of irradiation at room temperature. In other words, for a given reverse recovery time, a device irradiated at an elevated temperature shows a lower forward voltage drop than would be obtained if the device were irradiated at room temperature. Thus, the advantage of a faster turnoff is obtained at a smaller penalty.

Occasionally, it may be desired to provide semiconductor devices with extremely short turnoff times even at the expense of a higher forward voltage drop. Or, it may be occasionally desired to provide semiconductor devices with turnoff times which, while improved as compared to non-irradiated devices, are only moderately fast in order that forward voltage drop may be kept relatively low. Generally, however, the compromise between these characteristics that is desired is represented by the point on the trade-off curve closest to the origin. Inasmuch as it is that region of the trade-off curve near the origin that is of greatest interest, FIG. 2, restricted to that region, is included for easier analysis. While a point-by-point comparison between FIG. 2 and the corresponding portion of FIG. 1 will show an excellent correlation, it should be realized that the data for FIG. 2 was obtained by irradiating a different group of semiconductor devices, thus indicating that the results herein set forth are quite reproducible.

Figure 2:
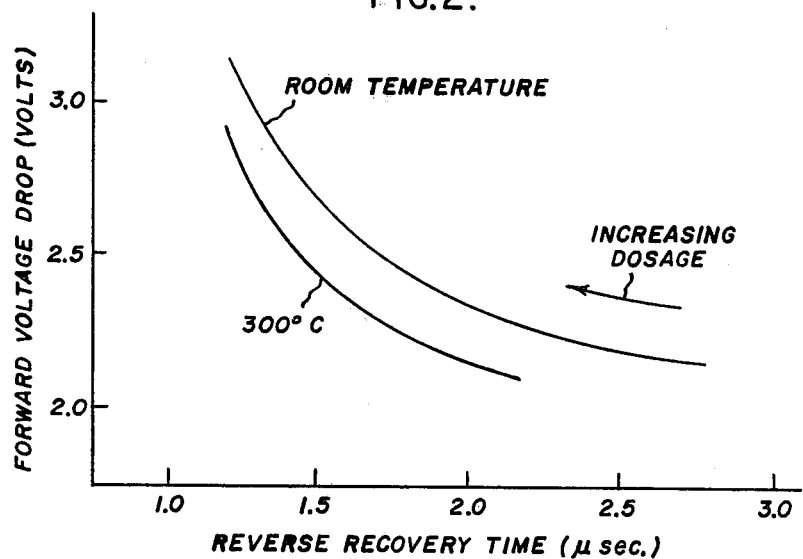
FIG. 2 is a graph similar to FIG. 1 but showing in more detail an area of particular interest.

A useful comparison between room temperature irradiation and elevated temperature irradiation can be made by comparing vertically aligned points of FIGS. 1 or 2. Vertically aligned points represent semiconductor devices irradiated at room temperature or at an elevated temperature to the extent necessary to provide equivalent turnoff times. It will be apreciated that at all points shown in FIGS. 1 and 2, the room temperature irradiated devices, for equivalent turnoff times, exhibit a higher forward voltage drop. The data of FIG. 1 was used to generate FIG. 3 which plots, as a function of reverse recovery time in microseconds, the difference in forward voltage drop ( $\delta\delta V_f$) between devices irradiated at room temperature and those irradiated at an elevated temperature. It will be observed that at higher reverse recovery times, the difference in forward voltage drop is not great, for example, less than one half volt. However, as the devices are irradiated to increasingly higher levels to provide shorter reverse recovery times, it is observed that room temperature irradiation causes voltage drops of up to several volts higher. Thus, an advantage of the elevated temperature irradiation is clearly pointed out.

Figure 4:
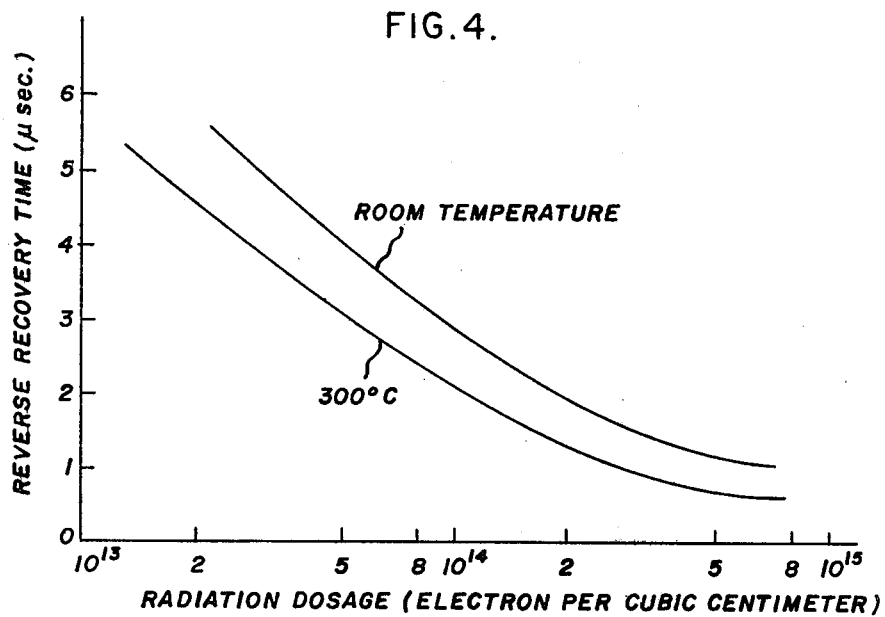
FIG. 4 is a graph showing the effect of different irradiation dosages on reverse recovery time for devices irradiated at room temperature and devices irradiated at an elevated temperature.

Referring now to FIG. 4, there is a graph showing the effect of various radiation dosages (expressed as electrons per cubic centimeter) on the reverse recovery time of a device. Both room temperature and elevated temerature irradiation is considered. It will be appreciated that for all dosages within the range of FIG. 4, the effectiveness of a given degree of radiation is more pronounced if the irradiation is carried out at a higher temperature.

As is taught in the aforementioned U.S. Pat. Nos. 3,881,964 and 3,888,071, devices irradiated at room temperature can be tailored to provide the characteristics more similar to those of devices irradiated at an elevated temperature, but only at the cost of one or more relatively long annealing steps. It will be appreciated from the foregoing that the present invention eliminates the excessively long annealing steps. Furthermore, it will be appreciated from an observation of FIG. 4 that the required dosage of irradiation, or, expressed differently, that the period of time for which irradiation must be carried out is reduced by irradiating at an elevated temperature. It is felt that the reason for this latter effect is that the combined energy imparted to the crystal by both the irradiation and the thermal effects is of a level which makes the crystal much more susceptible to damage and thus the desired effect of the irradiation is achieved faster.

It is not believed that there is any threshold temperature only above which elevated temperature becomes more effective. There may, however, be a practical limit. It is believed that as temperatures are increased significantly above room temperature (above, for example 100° C), the synergistic effect of the two energy sources described above becomes important. Preferably, the elevated temperature irradiation is carried out in the range of about 150° to 375° C. This range represents a compromise of several competing effects. It is believed high enough to provide effective thermal energy yet low enough that it is easy to achieve. Preferably, the devices are irradiated at temperatures below about 500° C to maximize the efficiency of the process.

Figure 5:
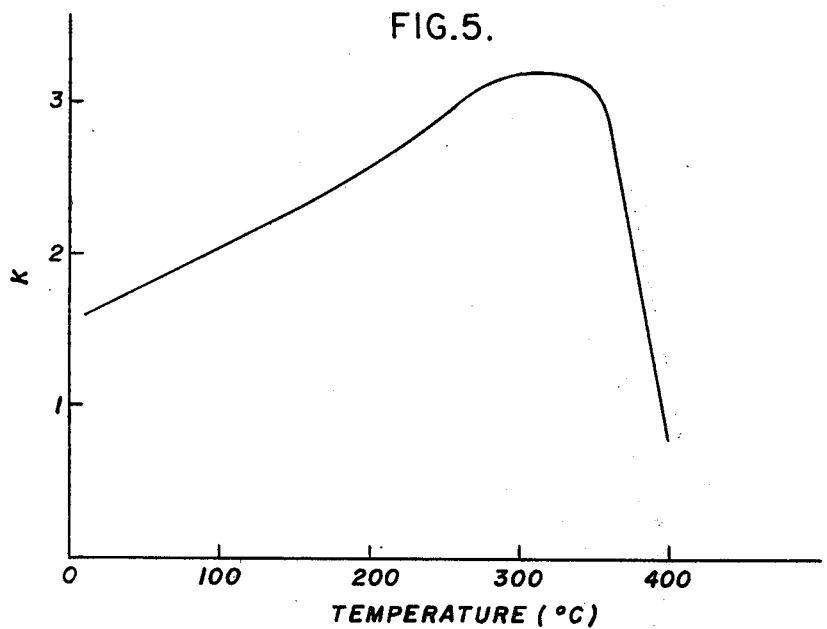
FIG. 5 shows the effectiveness of irradiation as a function of temperature.

Referring now to FIG. 5, there is shown quantitatively the effect of irradiation on semiconductor devices as a function of temperature. Specifically, the graph plots K versus temperature where K is irradiation efficiency as defined by:

$$\frac{1}{t_a} = \frac{1}{t_b} + K\phi \tag{1}$$

where:

$t_a$ = turnoff time after irradiation
$t_b$ = turnoff time before irradiation
$K$ = irradiation efficiency in $$\frac{cm^2}{electrons - seconds}$$

$\phi$ = dosage in $$\frac{electrons}{cm^2}$$

It will be appreciated from equation 1 that the higher K is, the more effective a given dosage is. FIG. 5 makes plain that approximately 300° C is the most effective irradiation temperature for the particular conditions used to generate the data for FIG. 5. The curve may shift as electron energy and other variables are changed.

It is most effective to utilize electron irradiation and preferably irradiation having an energy in excess of about 250 Kev. It is felt that energies below this level result in too many elastic collisions to provide effective lattice damage. Most preferably, the irradiation is of an energy level of about 1.5 to 12 Mev.

It is preferred that the dosage of radiation in the semiconductor device be between $5 \times 10^{12}$ and $5 \times 10^{15}$ electrons per cubic centimeter. It is felt that dosages significantly below this level are inadequate to obtain commercially significant results and, dosages significantly above this level are undesirable due to extensive lattice damage.

Different types of commercially available irradiation equipment will work. Electron irradiation equipment supplying a beam current of 100 to 500 microamperes will supply adequate dosages in 1 to 7 minutes. If a desired dosage is known, those skilled in the art can easily determine the time required at a given current.

Figure 6:
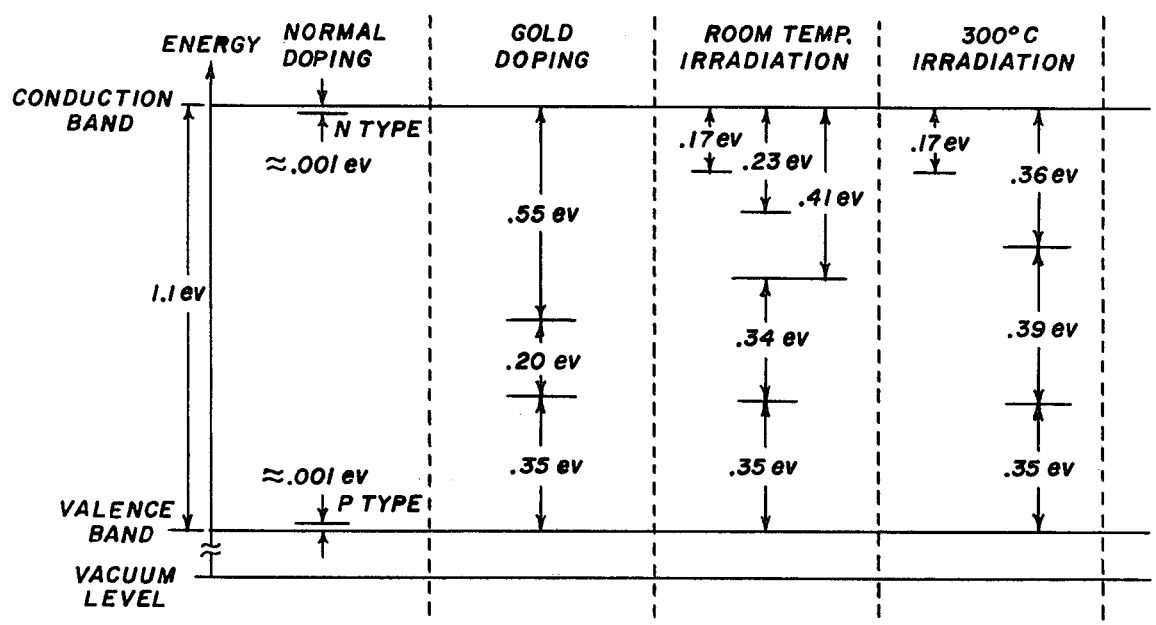
FIG. 6 is a diagram showing the electron energy levels in silicon under various doping and irradiation conditions.

Referring now to FIG. 6, there is a diagram illustrating some of the electron energy levels in silicon for particular doping types and irradiation levels. Referring first to the left column, indicating "Normal Doping". In silicon, as in most atoms, the outer electrons are normally in the valence band. In pure silicon, the next higher energy level that any of the electrons normally can achieve is represented by the conduction band which is 1.1 electron volts above the valence band.

Normal shallow level semiconductor doping creates permissible energy levels slightly below and slightly above the conduction and valence bands, respectively. Specifically, conventional n-type dopants in silicon create an energy level approximately 0.001 electron volts below the conduction level. Normal p-type dopants create a permissible level approximatly 0.001 electron volts above the valence band. Clearly moving from the valence band to a level created by a p-type dopant, or moving from the conduction band to a level created by an n-type dopant, is relatively easy within the semiconductor crystal.

What is more difficult for an electron to do is to move from either the conduction band or the level created by an n-type dopant to the valence band or to a level created by a p-type dopant. Such a transition requires an energy change of about 1.1 electron volts, reducing the likelihood of the transition. Furthermore, certain other constraints must be observed during such an energy transformation, for example, conservation of momentum. Consequently, such large transformations are not likely to occur rapidly. Yet these are the transitions which must take place to fully "turn off" a semiconductor device. Thus, minority charge carriers present within a doped semiconductor crystal after the electric energy has been removed therefrom do not rapidly recombine within the crystal and turnoff time becomes a problem.

The next column of energy levels in FIG. 6 represents those generated by gold doping. Two new levels are created. One is 0.55 electron volts below the conduction band, precisely between the conduction band and the valence band. The other is 0.35 electron volts above the valence band. It is evident why gold doping shortens carrier lifetime in a semiconductor crystal. The transition of an electron from the conduction band to the level 0.55 electron volts below the conduction band and thence directly, or indirectly, to the valence band is more likely to occur than the transition of an electron directly from the conduction band to the valence band.

The next two columns illustrate the energy levels generated by room temperature irradiation and elevated temperature (300° C) irradiation, respectively. It should be appreciated that in these two columns only the major energy levels created are shown. There are many more levels generated, but they are generated in such small numbers that they are not believed important to an understanding of device operation.

The primary difference between the room temperature irradiation and the elevated temperature irradiation is that the room temperature irradiation provides energy levels at 0.23 electron volts and 0.41 electron volts below the conduction band. Those two levels are absent from the elevated temperature irradiation but in their place is an intermediate level 0.36 electron volts below the conduction band.

Figure 3:
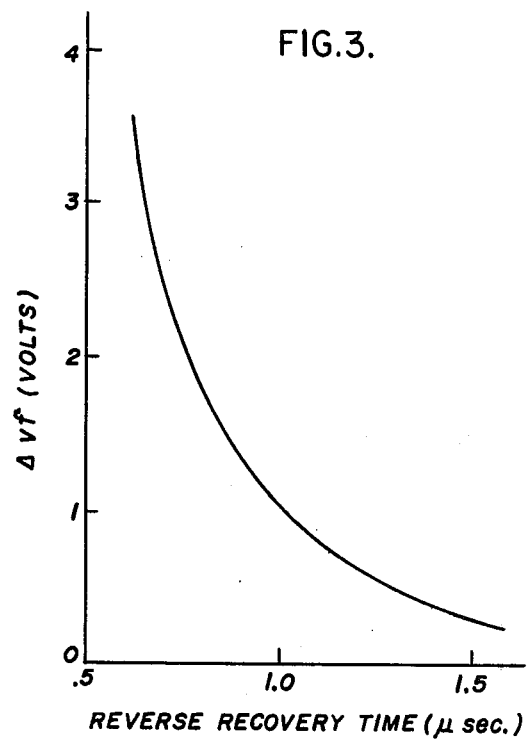
FIG. 3 is a graph illustrating the difference in forward voltage drops between devices irradiated at room temperature and devices irradiated at an elevated temperature as a function of reverse recovery times.

It is significant to note that if a device is irradiated at room temperature and later annealed at 300° C, the recombination centers 0.23 ev. and 0.41 ev. below the conduction band begin to disappear and in their place appears a recombination center 0.36 ev. below the conduction band. In other words, elevated temperature irradiation provides results equivalent to room temperature irradiation and a long elevated temperature anneal in a time equal to or less than that required for room temperature irradiation alone. (Actually the elevated temperature irradiation results are better, as shown by FIGS. 1, 2, and 3. This may be due to other energy levels.) Consequently, there is a substantial cost and energy saving obtained by the use of elevated temperature irradiation.

Stated more generally, it is believed that a long anneal cycle subsequent to a low temperature irradiation step can be dispensed with simply by performing the irradiation at the temperature which would have been the annealing temperature.

Figure 7:
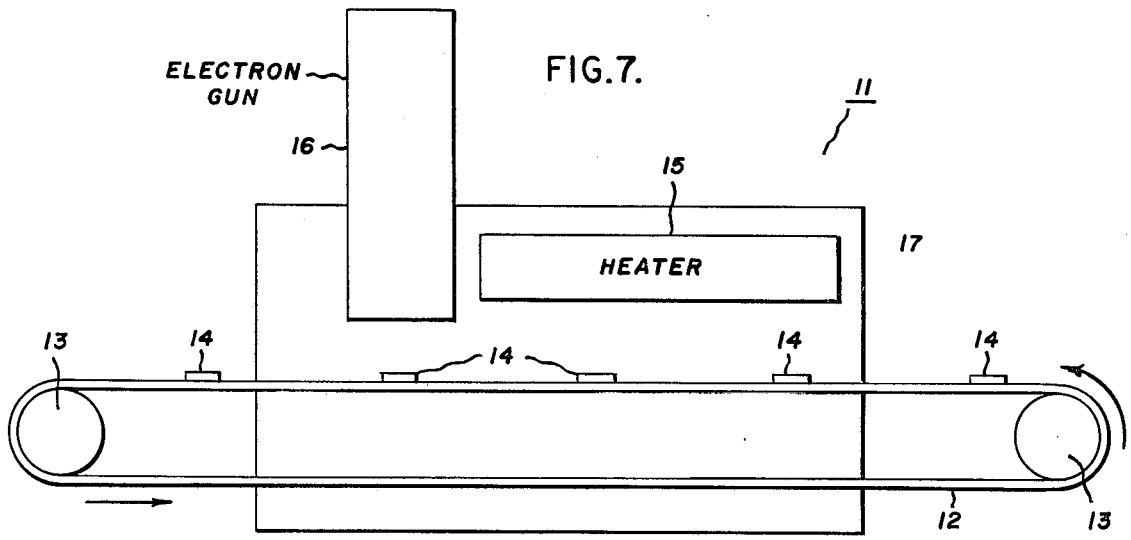
FIG. 7 is a diagrammatic elevation view of apparatus suitable for the practice of the subject invention.

Referring now to FIG. 7, there is illustrated diagrammatically an apparatus 11 for performing elevated temperature irradiation. An endless conveyor belt 12, preferably of thermally insulating material, travels counterclockwise around two rollers 13 to convey semiconductor wafers 14 through the apparatus 11. A heater 15 and a portion of an electron gun 16 are contained within a housing 17. For clarity, the housing is diagrammatically shown as cut away. The heater 15 can be of any desired type, such as infrared or electrical resistance, and is used to raise the temperature of the semiconductor wafers 14 and of the atmosphere within the housing 17 to the desired irradiation temperature. Following temperature stabilization, the wafers 14 pass under the electron gun 16 where they are irradiated with electrons of the chosen energy level. The time and dosage of irradiation are determined by proper selection of conveyor belt speed, the size of the region irradiated by the gun, and the beam current. For very large dosage levels, and thus long irradiation times, or for large wafers, several electron guns may be utilized.

FIG. 7 should be understood to be simply diagrammatic in nature. Many different configurations for irradiation apparatus will be apparent to those skilled in the semiconductor processing arts.

In view of the foregoing, many other modifications and variations of the present invention will be apparent to those skilled in the art. For example, depending on beam current (if electron irradiation is chosen), radiation energy, desired dosage, and the like, the radiation time may be less than one minute or in the range of hours. It is to be understood therefore that the invention can be practiced otherwise than as specifically described.

What is claimed is:

1. A method of adjusting the electrical characteristics of a semiconductor device comprising forming deep level recombination centers by subjecting the monocrystalline semiconductor material of said device at a temperature in the range of about 150° to 375° C to impact by crystal lattice-damaging electrons (with irradiation) of an energy level in excess of about 250 Kev.

2. A method according to claim 1 wherein said device (is selected from the group consisting of SCRs, rectifiers, and triacs) contains at least one P/N junction.

3. A method according to claim 1 wherein said (radiation is electron irradiation and is) electrons are supplied by irradiation of an energy level in the range of about 1.5 to about 12 Mev.

4. A method according to claim 3 wherein the dosage of irradiation applied is in the range of about $5 \times 10^{12}$ electrons per cubic centimeter to about $5 \times 10^{15}$ electrons per cubic centimeter.

5. A method of adjusting the electrical characteristics of a semiconductor device comprising subjecting said device to electron irradiation of an energy in the range of about 1.5 to about 12 Mev at a temperature in the range of 150° to 375° C until a dosage of about $5 \times 10^{12}$ electrons per cubic centimeter to about $5 \times 10^{15}$ electrons per cubic centimeter has been obtained.

* * * * *

UNITED STATES PATENT AND TRADEMARK OFFICE
CERTIFICATE OF CORRECTION

PATENT NO. : 4,043,836
DATED : August 23, 1977
INVENTOR(S) : Yen Sheng Edmund Sun It is certified that error appears in the above-identified patent and that said Letters Patent are hereby corrected as shown below:

Claim 1, Col. 8, Lines 4,5, delete "(with irradiation)"

Claim 2, Col. 8, Lines 7,8, delete "(is selected from the group consisting of SCRs, rectifiers, and triacs)"

Claim 3, Col. 8, Lines 1,2, delete "(radiation is electron irradiation and is)"

Signed and Sealed this

Tenth Day of January 1978

[SEAL]

Attest:

RUTH C. MASON
Attesting Officer

LUTRELLE F. PARKER
Acting Commissioner of Patents and Trademarks